United States Patent
Wang et al.

(10) Patent No.: US 9,735,590 B2
(45) Date of Patent: Aug. 15, 2017

(54) SYSTEMS AND METHODS FOR HIDDEN BATTERY CELL CHARGING AND CONDITIONING

(71) Applicant: Dell Products L.P., Round Rock, TX (US)

(72) Inventors: Lei Wang, Austin, TX (US); Stuart Allen Berke, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 5 days.

(21) Appl. No.: 14/839,543

(22) Filed: Aug. 28, 2015

(65) Prior Publication Data

US 2017/0063108 A1    Mar. 2, 2017

(51) Int. Cl.
| | |
|---|---|
| G06F 1/26 | (2006.01) |
| H02J 7/00 | (2006.01) |
| G06F 1/30 | (2006.01) |
| H01M 10/44 | (2006.01) |

(52) U.S. Cl.
CPC .............. *H02J 7/0016* (2013.01); *G06F 1/26* (2013.01); *G06F 1/263* (2013.01); *G06F 1/30* (2013.01); *H01M 10/441* (2013.01); *H02J 7/0021* (2013.01); *H02J 7/0068* (2013.01)

(58) Field of Classification Search
None
See application file for complete search history.

(56) References Cited

U.S. PATENT DOCUMENTS

| | | | |
|---|---|---|---|
| 5,650,240 A | * | 7/1997 | Rogers ................. H01M 6/5011 337/15 |
| 7,880,437 B2 | | 2/2011 | Wang et al. |
| 8,129,946 B2 | | 3/2012 | Wang et al. |
| 8,307,222 B2 | | 11/2012 | Wang et al. |
| 2010/0270975 A1 | | 10/2010 | Wong et al. |
| 2014/0298045 A1 | | 10/2014 | Sieber et al. |
| 2016/0231385 A1 | * | 8/2016 | Bulur ................. G01R 31/3606 |

OTHER PUBLICATIONS

Lawson, Barrie, A Software Configurable Battery, EVS26 International Battery, Hybrid and Fuel Cell Electric Vehicle Symposium, Los Angeles, CA May 6-9, 2012, 12 pages.
Manenti, Antonio, et al., A New BMS Architecture Based on Cell Redundancy, IEEE Transactions on Industrial Electronics, vol. 58, No. 9, Sep. 2011, pp. 4314-4322.

* cited by examiner

*Primary Examiner* — Paul Yanchus, III
(74) *Attorney, Agent, or Firm* — Jackson Walker L.L.P.

(57) ABSTRACT

In accordance with embodiments of the present disclosure, an information handling system may include at least one information handling resource and a battery for supplying electrical energy to the at least one information handling resource. The battery may include a plurality of series-coupled cells and a plurality of switching devices arranged with respect to the plurality of series-coupled cells, the plurality of switching devices configured to be selectively and independently activated and deactivated in order to simultaneously enable one or more of the plurality of series-coupled cells to generate a portion of an output voltage delivered to the at least one information handling resource and bypass one or more of the plurality of series-coupled cells.

18 Claims, 4 Drawing Sheets

SYSTEMS AND METHODS FOR HIDDEN BATTERY CELL CHARGING AND CONDITIONING

TECHNICAL FIELD

The present disclosure relates in general to information handling systems, and more particularly to systems and methods for providing for hidden battery cell charging and conditioning.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems are increasingly using persistent memory technologies such as Non-Volatile Dual In-line Memory Modules (NVDIMMs). An NVDIMM is a memory module that may retain data even when electrical power is removed either from an unexpected power loss, system crash or from a normal system shutdown. To enable such functionality, an NVDIMM may include a traditional dynamic random access memory (DRAM) which may store data during normal operation when electrical power is available from a power supply unit and a flash memory to back up data present in the DRAM when a loss of electrical power from the power supply unit occurs. A battery, capacitor, or other energy storage device either internal or external to the NVDIMM may supply electrical energy for a "save" operation to transfer data from the DRAM to the flash memory in response to a power loss event from the power supply unit.

In order to periodically charge or condition a traditional battery, it may be required to take such battery offline such that it cannot be used to provide energy for hold-up during such charging or conditioning. However, many applications and usage models that depend on persistent memory cannot tolerate any periods during normal operation in which the battery is unavailable, as it could lead to data vulnerability in the event of a loss of input power supply.

SUMMARY

In accordance with the teachings of the present disclosure, the disadvantages and problems associated with existing approaches to providing an energy storage device for a persistent memory may be reduced or eliminated.

In accordance with embodiments of the present disclosure, an information handling system may include at least one information handling resource and a battery for supplying electrical energy to the at least one information handling resource. The battery may include a plurality of series-coupled cells and a plurality of switching devices arranged with respect to the plurality of series-coupled cells, the plurality of switching devices configured to be selectively and independently activated and deactivated in order to simultaneously enable one or more of the plurality of series-coupled cells to generate a portion of an output voltage delivered to the at least one information handling resource and bypass one or more of the plurality of series-coupled cells.

In accordance with these and other embodiments of the present disclosure a battery may include a plurality of series-coupled cells and a plurality of switching devices arranged with respect to the plurality of series-coupled cells, the plurality of switching devices configured to be selectively and independently activated and deactivated in order to simultaneously enable one or more of the plurality of series-coupled cells to generate a portion of an output voltage delivered to the at least one information handling resource and bypass one or more of the plurality of series-coupled cells.

In accordance with these and other embodiments of the present disclosure, a method may include selectively and independently activating and deactivating a plurality of switching devices arranged with respect to a plurality of series-coupled cells of a battery, in order to simultaneously enable one or more of the plurality of series-coupled cells to generate a portion of an output voltage delivered to at least one information handling resource and bypass one or more of the plurality of series-coupled cells.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1 through 4, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal data assistant (PDA), a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, service processors, basic input/output systems (BIOSs), buses, memories, I/O devices and/or interfaces, storage resources, network interfaces, motherboards, power supplies, air movers (e.g., fans and blowers) and/or any other components and/or elements of an information handling system.

Figure 1:
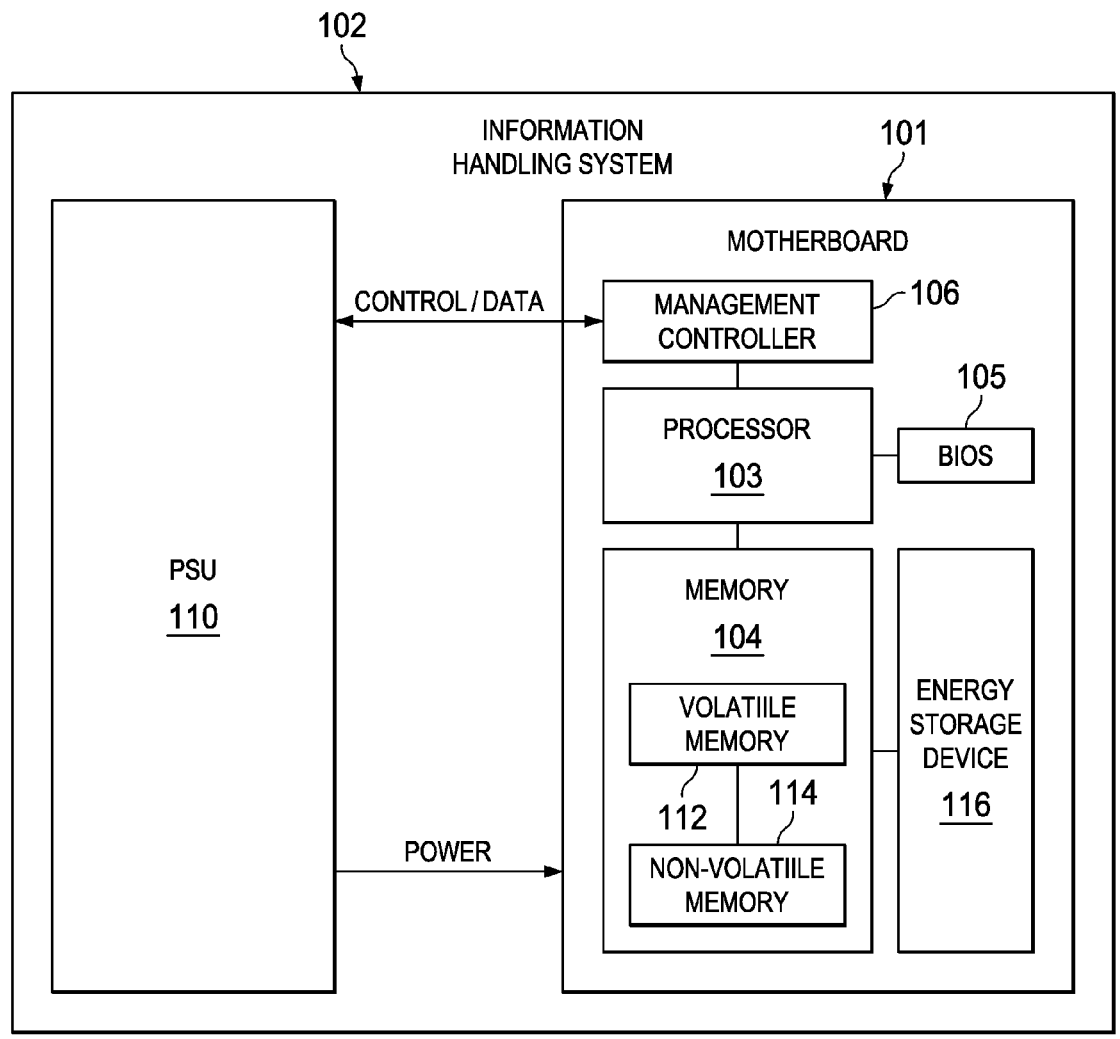
FIG. 1 illustrates a block diagram of an example information handling system, in accordance with embodiments of the present disclosure.

FIG. 1 illustrates a block diagram of an example of an information handling system 102. As depicted, information handling system 102 may include a power supply unit (PSU) 110, a motherboard 101, and one or more other information handling resources.

Motherboard 101 may include a circuit board configured to provide structural support for one or more information handling resources of information handling system 102 and/or electrically couple one or more of such information handling resources to each other and/or to other electric or electronic components external to information handling system 102. As shown in FIG. 1, motherboard 101 may include a processor 103, memory 104, a BIOS 105, a management controller 106, and an energy storage device 116, and one or more other information handling resources.

Processor 103 may comprise any system, device, or apparatus operable to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in memory 104 and/or another component of information handling system 102.

Memory 104 may be communicatively coupled to processor 103 and may comprise any system, device, or apparatus operable to retain program instructions or data for a period of time. Memory 104 may comprise random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to information handling system 102 is turned off. As shown in FIG. 1, memory 104 may comprise a persistent memory (e.g., comprising one or more NVDIMMs) that includes a volatile memory 112 (e.g., DRAM or other volatile random-access memory) and non-volatile memory 114 (e.g., flash memory or other non-volatile memory). During normal operation, when PSU 110 provides adequate power to components of information handling system 102, data written to memory 104 from processor 103 may be stored in volatile memory 112. However, in the event of an input power loss or power fault of PSU 110 that prevents delivery of electrical energy from PSU 110 to memory 104, data stored in volatile memory 112 may be transferred to non-volatile memory 114 in a save operation. After input power is restored, or a faulty PSU 110 is replaced, such that PSU 110 is again operable to provide electrical energy to information handling resources of information handling system 102, on the subsequent power-on of information handling system 102, data may be copied from the non-volatile memory 114 back to volatile memory 112 via a restore operation. The combined actions of data save and then data restore, allows the data to remain persistent through a power disruption. Accordingly, although not explicitly shown in FIG. 1, memory 104 may also include hardware, firmware, and/or software for carrying out save operations.

A BIOS 105 may include any system, device, or apparatus configured to identify, test, and/or initialize information handling resources of information handling system 102, and/or initialize interoperation of information handling system 102 with other information handling systems. "BIOS" may broadly refer to any system, device, or apparatus configured to perform such functionality, including without limitation, a Unified Extensible Firmware Interface (UEFI). In some embodiments, BIOS 105 may be implemented as a program of instructions that may be read by and executed on processor 103 to carry out the functionality of BIOS 105. In these and other embodiments, BIOS 105 may comprise boot firmware configured to be the first code executed by processor 103 when information handling system 102 is booted and/or powered on. As part of its initialization functionality, code for BIOS 105 may be configured to set components of information handling system 102 into a known state, so that one or more applications (e.g., an operating system or other application programs) stored on compatible media (e.g., disk drives) may be executed by processor 103 and given control of information handling system 102.

Management controller 106 may be configured to provide out-of-band management facilities for management of information handling system 102. Such management may be made by management controller 106 even if information handling system 102 is powered off or powered to a standby state. Management controller 106 may include a processor, memory, an out-of-band network interface separate from and physically isolated from an in-band network interface of information handling system 102, and/or other embedded information handling resources. In certain embodiments, management controller 106 may include or may be an integral part of a baseboard management controller (BMC) or a remote access controller (e.g., a Dell Remote Access Controller or Integrated Dell Remote Access Controller). In other embodiments, management controller 106 may include or may be an integral part of a chassis management controller (CMC). In some embodiments, management controller 106 may be configured to communicate with a PSU 110 to communicate control and/or telemetry data between management controller 106 and PSU 110. For example, PSU 110 may communicate information regarding status and/or health of PSU 110 and/or measurements of electrical parameters (e.g., electrical currents or voltages) present within PSU 110.

Generally speaking, PSU 110 may include any system, device, or apparatus configured to supply electrical current to one or more information handling resources of information handling system 102.

Figure 2:
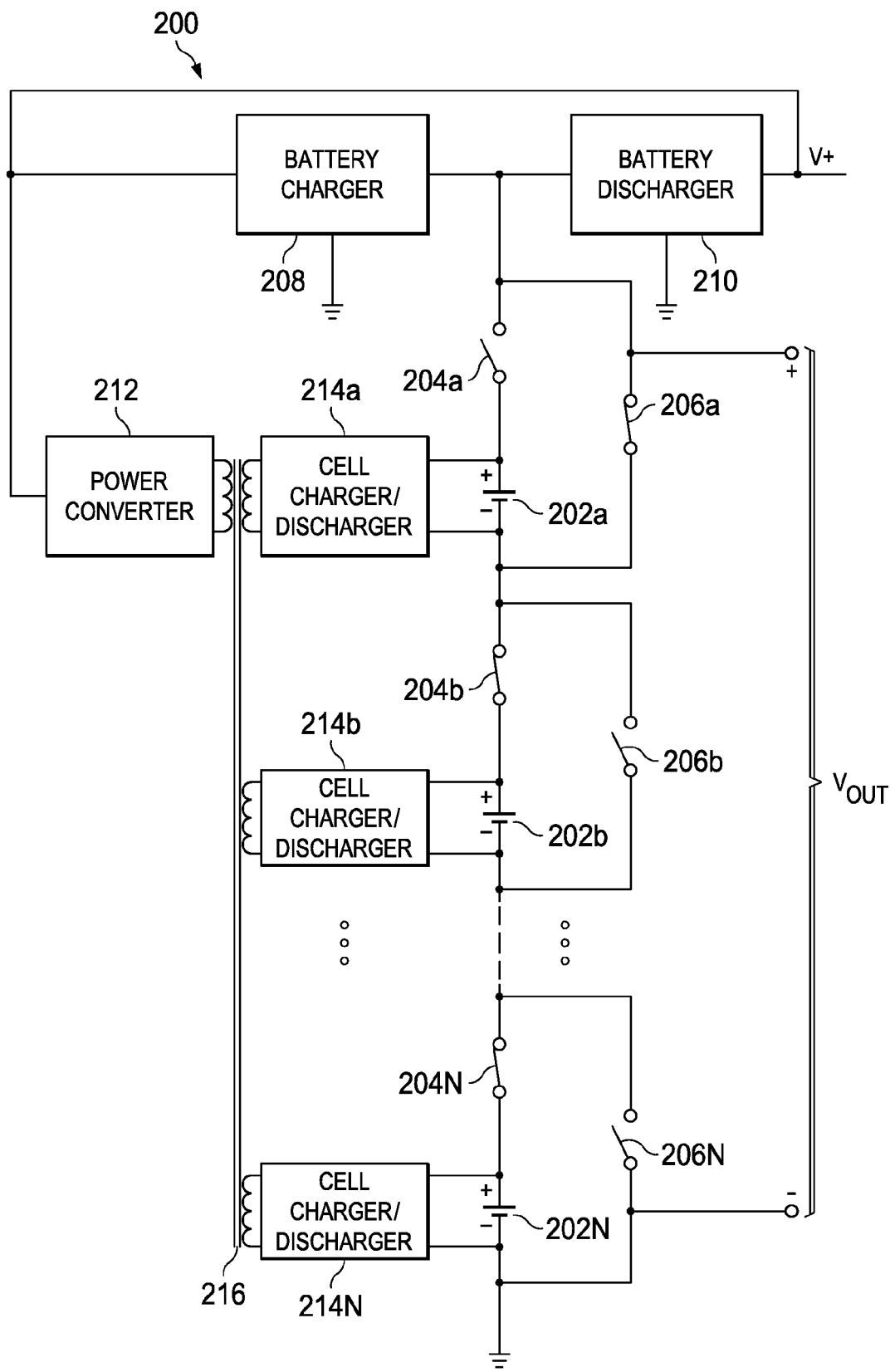
FIG. 2 illustrates a block diagram of an example battery, in accordance with embodiments of the present disclosure.
Figure 3:
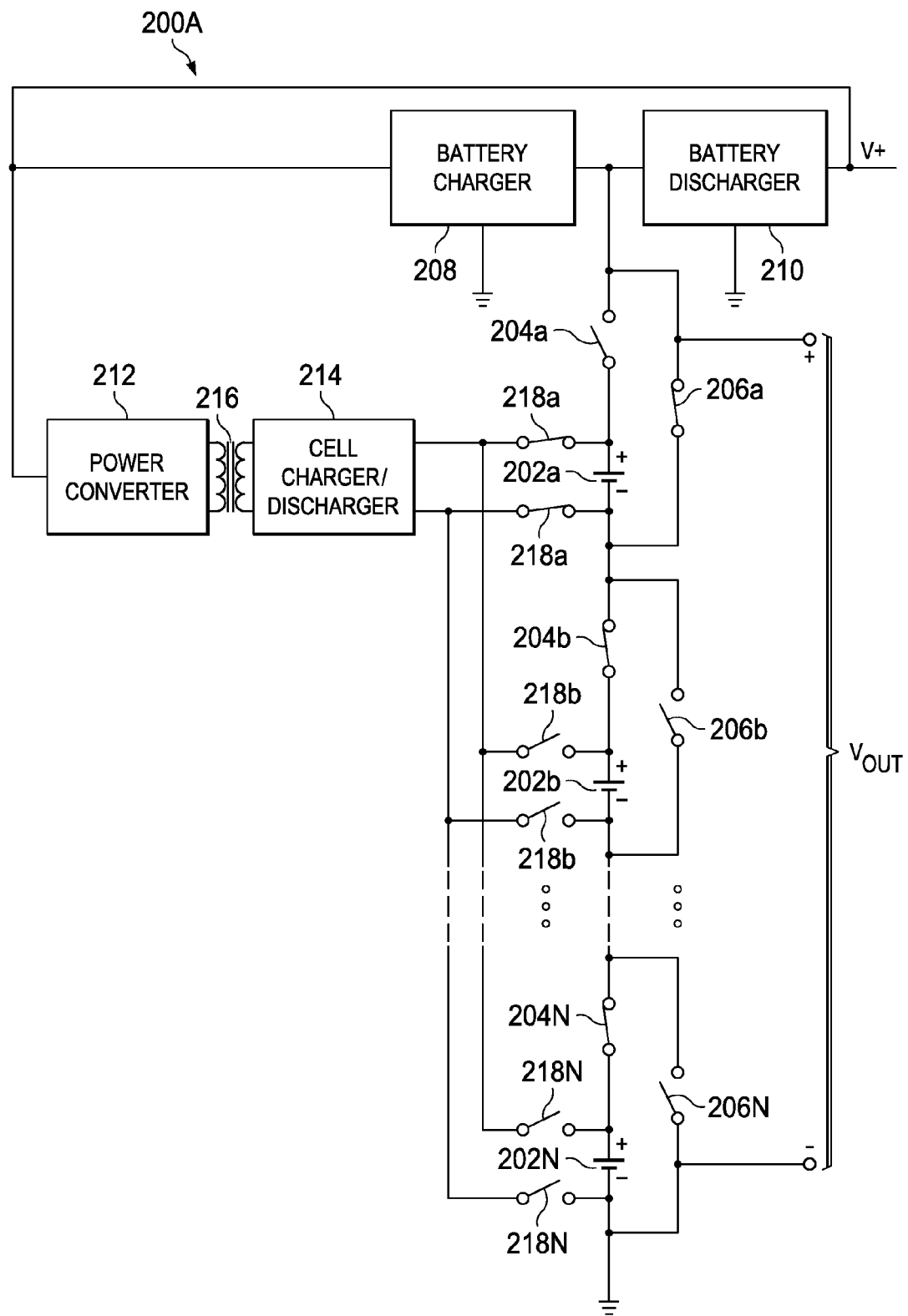
FIG. 3 illustrates a block diagram of another example battery, in accordance with embodiments of the present disclosure.

Energy storage device 116 may comprise any system, device, or apparatus configured to store energy which may be used by memory 104 to perform save operations in response to a loss of system input power source (e.g., alternating current or direct current input source) or a power fault of PSU 110. In some embodiments, persistent memory 104 may require the voltage output of energy storage device 116 to be maintained within a specific operating range, for example, 10.2 volts to 13.8 volts DC throughout the save operation. In some embodiments, energy storage device 116 may comprise a battery configured to convert stored chemical energy into electrical energy. In other embodiments, energy storage device 116 may comprise a capacitor or "supercap" configured to store electrical energy and deliver such electrical energy to memory 104 when needed to perform save operations (e.g., by closure of a switch to electrically couple such capacitor to components of memory 104). Although energy storage device 116 is shown in FIG. 1 as external to memory 104, in some embodiments energy storage device 116 may be integral to memory 104. In these and other embodiments, energy storage device 116 may be charged from PSU 110. FIGS. 2 and 3 below depict example embodiments of energy storage device 116 in which energy storage device 116 comprises a battery with a plurality of cells in series.

In addition to motherboard 101, processor 103, memory 104, BIOS 105, management controller 106, energy storage device 116, and PSU 110, information handling system 102 may include one or more other information handling resources. For example, in some embodiments, information handling system 102 may include more than one PSU 110 and/or more than one energy storage device 116.

FIG. 2 illustrates a block diagram of an example battery 200, in accordance with embodiments of the present disclosure. In some embodiments, battery 200 may be used to implement energy storage device 116. In other embodiments, battery 200 may be used to provide for storage and delivery of energy for electric and/or electronic components other than a persistent memory and/or other than for information handling resources of an information handling system. As shown in FIG. 2, battery 200 may comprise a plurality of series coupled cells 202a-202N (which may individually be referred to as a "cell 202" and collectively referred to as "cells 202"), a plurality of cell-enabling switches 204a-204N (which may individually be referred to as a "cell-enabling switch 204" and collectively referred to as "cell-enabling switches 204"), a plurality of bypass switches 206a-206N (which may individually be referred to as a "bypass switch 206" and collectively referred to as "bypass switches 206"), a battery charger 208, a battery discharger 210, a power converter 212, and a plurality of cell charger/dischargers 214a-214N (which may individually be referred to as a "cell charger/discharger 214" and collectively referred to as "cell charger/dischargers 214").

Each cell 202 may comprise any system, device, or apparatus capable of converting chemical energy into electrical energy (discharging) and/or vice versa (charging). As shown in FIG. 2, each cell 202 may be arranged in series with an associated enabling switch 204. In addition, each series combination of a cell 202 and its associated enabling switch 204 may be arranged in parallel with an associated bypass switch 206. Each switch 204 and 206 may comprise any electrical or electronic component that may be selectively activated (e.g., enabled, closed, or turned on) to complete an electrical circuit (e.g., create a conductive path between two points) and deactivated (e.g., disabled, open, or turned off) to break an electrical circuit (e.g., break a conductive path between two points). In some embodiments, one or more of switches 204 and 206 may be implemented as an n-type metal-oxide-semiconductor field-effect transistor (n-MOSFET). Although not shown explicitly in FIG. 2, each switch 204 and 206 may be activated and deactivated by a respective control signal (e.g., applied to a gate of an n-MOSFET). Such control signals may be generated by any suitable component of information handling system 102, including without limitation processor 103, management controller 106, or an integrated controller (not explicitly shown, for purposes of ease of exposition) of battery 200.

When an enabling switch 204 is activated, its associated cell 202 may be coupled in series with one or more other cells 202. When a bypass switch 206 is activated, a short circuit may be formed in parallel with its associated cell 202, thus effectively bypassing such cell 202 and removing it from the series combination of cells 202. Thus, in the switch configuration shown in FIG. 2, bypass switch 206a is activated and enabling switch 204a is deactivated such that cell 202a is bypassed, while enabling switches 204b and 204N are activated and bypass switches 206b and 206N are deactivated such that cells 202b and 202N are enabled and contribute to the output voltage $V_{OUT}$. In some embodiments, whenever an enabling switch 204 activated, its associated bypass switch 206 may be deactivated, and vice versa.

In operation, battery 200 may output an output voltage $V_{out}$ equal to the approximate sum of the individual voltages of individual cells 202 within battery 200 which have their respective enabling switches 204 activated. Furthermore, cells 202 which are bypassed by having their respective bypass switches 206 activated may be tested (e.g., characterized and/or conditioned) and/or used as redundant cells 202 to be enabled in the event of a fault and/or testing of another cell 202. In some embodiments, a bypassed cell 202 may be one in which prior testing identified such bypassed cell 202 as having a fault rendering it unsuitable for use in battery 200. In some embodiments, output voltage $V_{out}$ of battery 200 must be maintained within a specific operating voltage range and tolerance, requiring enabling switches 204 and bypass switches 206 to be carefully controlled and sequenced accordingly.

Battery charger 208 may comprise any system, device, or apparatus for receiving an input source of electrical energy (e.g., a direct-current voltage V+ from PSU 110) and causing cells 202 of battery 200 to charge by electrical energy into chemical energy, in order that battery 200 outputs a desired output voltage $V_{out}$. In some embodiments, including those which may not require fast charge times, battery charger 208 may not be present given there are cell chargers/dischargers 214 for each cell 202.

Battery discharger 210 may comprise any system, device, or apparatus for causing cells 202 of battery 200 to discharge by converting chemical energy into electrical energy, in order that battery 200 outputs a desired output voltage $V_{out}$. Although not shown in FIG. 2 for purposes of clarity and ease of exposition, battery charger 208 and/or battery discharger 210 may operate in response to a feedback control loop or other control system that regulates output voltage $V_{out}$ at a desired voltage.

Figure 4:
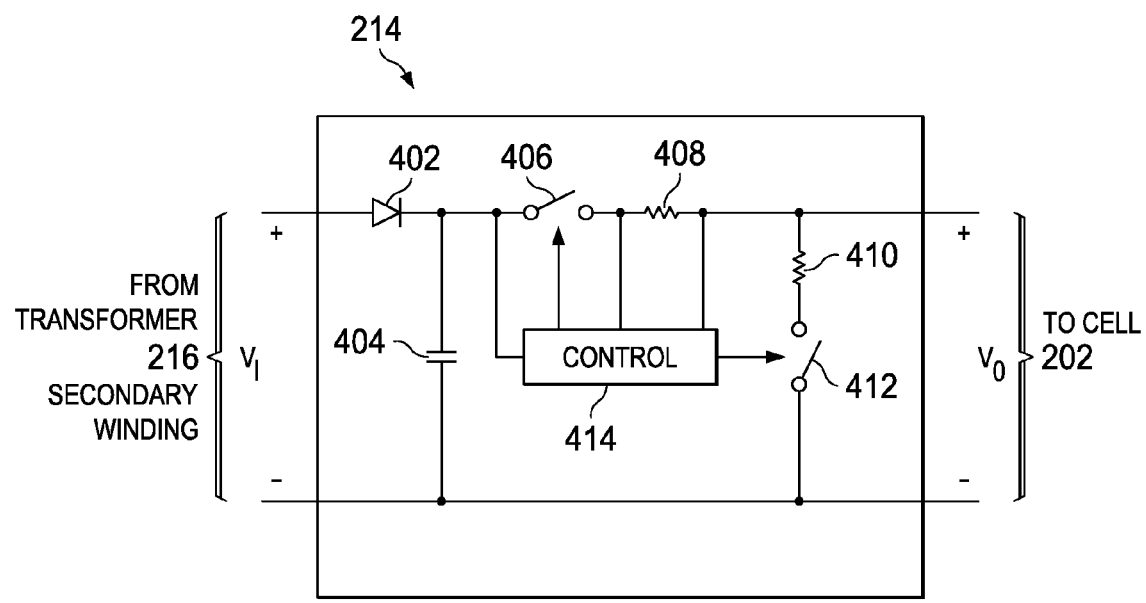
FIG. 4 illustrates a block/circuit diagram of an example cell charger/discharger, in accordance with embodiments of the present disclosure.

In addition to battery charger 208 and battery discharger 210 which operate at the system level in battery 200, cell charger/dischargers 214 may each be associated with a respective cell 202 for charging and/or discharging such cell 202. An example cell charger/discharger 214 is depicted in FIG. 4. In operation, each cell 202 may be periodically bypassed by its associated bypass switch 206. During such bypass, a cell 202 may be charged and/or discharged by its associated cell charger/discharger 214 as needed to test such cell 202. Such testing may include determining a state of health of such cell 202 (e.g., ability to recharge, deliver current, etc.), whether any faults exist within such cell 202 that may cause cell 202 to function inappropriately or undesirably (e.g., inability to generate sufficient voltage or current), and correcting state-of-charge fuel gauge errors by deeply discharging a cell 202 and recharging it back to full energy.

As shown in FIG. 2, in some embodiments each cell charger/discharger 214 may be isolated from another through an isolated converter/transformer comprising power converter 212 and transformer 216. Power converter 212 may comprise any suitable system, device, or apparatus for converting an input voltage (e.g., voltage V+ delivered from PSU 110) into another voltage. Examples of such a power converter 212 plus transformer 216 and secondary switching components are a flyback converter, forward converter, and push-pull converter. Transformer 216 may comprise a first winding coupled at the output of power converter 212 and a plurality of secondary windings each coupled to an associated cell charger/discharger 214.

FIG. 3 illustrates a block diagram of another example battery 200A, in accordance with embodiments of the present disclosure. In some embodiments, battery 200A may be used to implement energy storage device 116. In other embodiments, battery 200A may be used to provide for storage and delivery of energy for electric and/or electronic components other than a persistent memory and/or other than for information handling resources of an information handling system. Battery 200A is similar to battery 200 depicted in FIG. 2, and accordingly, only the main differences between battery 200A and battery 200 are discussed. As shown in FIG. 3, battery 200A may comprise a single cell charger/discharger 214 electrically coupled to power converter 212 and transformer 216 wherein isolation between cells 202 is provided by isolation switches 218a-218N. Thus, when a particular cell 202 is bypassed for testing (e.g., cell 202a in FIG. 3), isolation switches 218 associated with such cell 202 may be activated to allow cell charger/discharger 214 to charge and/or discharge such cell 202 for testing, while other isolation switches 218 may be deactivated to isolate their associated cells 202 from cell charger/discharger 214.

FIG. 4 illustrates block/circuit diagram of an example cell charger/discharger 214, in accordance with embodiments of the present disclosure. Cell charger/discharger 214 may comprise a diode 402, capacitor 404, switch 406, resistor 408, resistor 410, switch 412, and control 414 arranged as shown. In operation, to charge a cell 202 coupled to the output of cell charger/discharger 214, control 414 may enable switch 406 to charge cell 202 from an input voltage $V_I$ (e.g., received from a secondary winding of transformer 216). To discharge a cell 202 coupled to the output of cell charger/discharger 214, control 414 may enable switch 412 such that cell 202 discharges through resistor 410 and switch 412. Thus, cell charger/discharger 214 may be utilized to test a cell 202. For example, cell 202 may discharge through resistor 410 and switch 412. Thus, cell charger/discharger 214 may discharge a cell 202 to a particular level (e.g., 5% of maximum state of charge), which in some cases is determined by the battery voltage, and then recharge it to full in order to characterize parameters of cell 202, such as the time to charge, whether or not cell 202 is capable of charging to a threshold level, and correcting state-of-charge fuel gauge errors, etc. Although not shown in FIG. 4, a fuel gauge circuit and/or mechanism for detecting an output voltage $V_o$ of a cell charger/discharger 214 may be provided to assist in testing.

Although each cell 202 is shown in FIGS. 2 and 3 as a single electrochemical cell, in some embodiments, a cell 202 as shown in FIGS. 2 and 3 may be a "virtual" cell in the sense that it may comprise a plurality of physical electrochemical cells coupled in parallel with each other, which may allow such "virtual" cell to generate more current than if a single electrochemical cell was used.

Advantageously, the systems and methods herein may provide for a battery 200 with the ability to disable a cell 202 for testing/conditioning while allowing other cells 202 to continue providing electrical energy, wherein such testing/conditioning is for practical purposes "hidden" or "invisible" in the sense that it can be performed, by way of selectively enabling and bypassing cells, without affecting the output characteristics of battery 200. For example, in an application in which three series-coupled cells 202 are sufficient to provide required energy, battery 200 may comprise four cells 202 coupled as shown in FIGS. 2 and 3, with switches 204 and 206 periodically and selectively enabled and disabled such that three cells 202 are enabled and one cell 202 is bypassed at any given time, and wherein each cell 202 is periodically bypassed for testing and conditioning.

Furthermore, the systems and methods herein may provide for fault tolerance of a battery. For example, in an application in which three series-coupled cells 202 are sufficient to provide required energy, battery 200 may comprise five cells 202 coupled as shown in FIGS. 2 and 3, with switches 204 and 206 periodically and selectively enabled and disabled such that three cells 202 are enabled and two cells 202 are bypassed at any given time, and wherein each cell 202 is periodically bypassed for testing and conditioning. Of the two cells 202 bypassed at a given time, one may be tested/conditioned while one may serve as a backup or spare in the event of fault of a cell 202.

In addition, the systems and methods herein may provide for extended life of a battery. By periodically enabling and bypassing cells 202, a periodic disabling of a cell 202 in which it is not operating to provide a portion of the output voltage of battery 200 may serve to extend the life of such cell 202, and by extension, extend the life of battery 200.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. An information handling system comprising:
   at least one information handling resource; and
   a battery for supplying electrical energy to the at least one information handling resource, the battery comprising:
   a plurality of series-coupled cells;
   a plurality of switching devices arranged with respect to the plurality of series-coupled cells, the plurality of switching devices configured to be selectively and independently activated and deactivated in order to simultaneously enable one or more of the plurality of series-coupled cells to generate a portion of an output voltage delivered to the at least one information handling resource and bypass one or more of the plurality of series-coupled cells; and
   a plurality of charger/dischargers, each charger/discharger associated with a respective one of the plurality of series-coupled cells, each charger/discharger configured to charge and discharge its respective series-coupled cell for testing or conditioning of such series-coupled cell when such series-coupled cell is bypassed and each cell charger/discharger isolated from the other of the plurality of charger/dischargers through an isolated converter/transformer comprising a power converter and a transformer.

2. The information handling system of claim 1, wherein the plurality of switching devices are configured to activate and deactivate such that each cell of the plurality of series-coupled cells is periodically bypassed.

3. The information handling system of claim 1, wherein at least one of the one or more of the plurality of series-coupled cells which are bypassed are bypassed for testing or conditioning of such cells.

4. The information handling system of claim 1, wherein at least one of the one or more of the plurality of series-coupled cells which are bypassed is a redundant cell to provide fault tolerance in the event of a failure of another one of the plurality of series-coupled cells.

5. The information handling system of claim 1, wherein at least one of the plurality of series-coupled cells comprises a virtual cell of a plurality of electrochemical cells coupled in parallel with one another.

6. The information handling system of claim 1, wherein the battery maintains an output voltage within a specific operating voltage range and tolerance while the plurality of switching devices are selectively and independently activated and deactivated.

7. A battery comprising:
   a plurality of series-coupled cells;
   a plurality of switching devices arranged with respect to the plurality of series-coupled cells, the plurality of switching devices configured to be selectively and independently activated and deactivated in order to simultaneously enable one or more of the plurality of series-coupled cells to generate a portion of an output voltage delivered to the at least one information handling resource and bypass one or more of the plurality of series-coupled cells; and
   a plurality of charger/dischargers, each charger/discharger associated with a respective one of the plurality of series-coupled cells, each charger/discharger configured to charge and discharge its respective series-coupled cell for testing or conditioning of such series-coupled cell when such series-coupled cell is bypassed and each cell charger/discharger isolated from the other of the plurality of charger/dischargers through an isolated converter/transformer comprising a power converter and a transformer.

8. The battery of claim 7, wherein the plurality of switching devices are configured to activate and deactivate such that each cell of the plurality of series-coupled cells is periodically bypassed.

9. The battery of claim 7, wherein at least one of the one or more of the plurality of series-coupled cells which are bypassed are bypassed for testing or conditioning of such cells.

10. The battery of claim 7, wherein at least one of the one or more of the plurality of series-coupled cells which are bypassed is a redundant cell to provide fault tolerance in the event of a failure of another one of the plurality of series-coupled cells.

11. The battery of claim 7, wherein at least one of the plurality of series-coupled cells comprises a virtual cell of a plurality of electrochemical cells coupled in parallel with one another.

12. The battery of claim 7, wherein the battery maintains an output voltage within a specific operating voltage range and tolerance while the plurality of switching devices are selectively and independently activated and deactivated.

13. A method, comprising:
   selectively and independently activating and deactivating a plurality of switching devices arranged with respect to a plurality of series-coupled cells of a battery, in order to simultaneously enable one or more of the plurality of series-coupled cells to generate a portion of an output voltage delivered to at least one information handling resource and bypass one or more of the plurality of series-coupled cells; wherein the battery comprises a plurality of charger/dischargers, each charger/discharger associated with a respective one of the plurality of series-coupled cells, each charger/discharger configured to charge and discharge its respective series-coupled cell for testing or conditioning of such series-coupled cell when such series-coupled cell is bypassed and each cell charger/discharger isolated from the other of the plurality of charger/dischargers through an isolated converter/transformer comprising a power converter and a transformer.

14. The method of claim 13, wherein the plurality of switching devices are configured to activate and deactivate such that each cell of the plurality of series-coupled cells is periodically bypassed.

15. The method of claim 13, wherein at least one of the one or more of the plurality of series-coupled cells which are bypassed are bypassed for testing or conditioning of such cells.

16. The method of claim 13, wherein at least one of the one or more of the plurality of series-coupled cells which are bypassed is a redundant cell to provide fault tolerance in the event of a failure of another one of the plurality of series-coupled cells.

17. The method of claim 13, wherein at least one of the plurality of series-coupled cells comprises a virtual cell of a plurality of electrochemical cells coupled in parallel with one another.

18. The method of claim 13, further comprising maintaining an output voltage within a specific operating voltage range and tolerance while the plurality of switching devices are selectively and independently activated and deactivated.

* * * * *